(12) United States Patent
Hartel et al.

(10) Patent No.: US 7,635,020 B2
(45) Date of Patent: Dec. 22, 2009

(54) COOLANT GUIDING ELEMENT AND COOLANT GUIDING DEVICE

(75) Inventors: Marc Hartel, Reiskirchen (DE); Ralf Dahmer, Olpe (DE)

(73) Assignee: Rittal GmbH & Co. KG, Herborn (DE)

( * ) Notice: Subject to any disclaimer, the term of this patent is extended or adjusted under 35 U.S.C. 154(b) by 312 days.

(21) Appl. No.: 10/535,888

(22) PCT Filed: Mar. 3, 2004

(86) PCT No.: PCT/EP2004/002101
§ 371 (c)(1), (2), (4) Date: May 23, 2005

(87) PCT Pub. No.: WO2004/082088
PCT Pub. Date: Sep. 23, 2004

(65) Prior Publication Data
US 2006/0162946 A1     Jul. 27, 2006

(30) Foreign Application Priority Data
Mar. 11, 2003 (DE) ................ 103 11 380

(51) Int. Cl.
*F28D 1/04* (2006.01)
(52) U.S. Cl. .......... 165/157; 165/160; 165/169
(58) Field of Classification Search ......... 165/174, 165/176, 157, 159, 160, 169, 104.33, 104.19; 62/406, 408; 174/9 F, 10; 138/115; 108/106; 312/265.1
See application file for complete search history.

(56) References Cited

U.S. PATENT DOCUMENTS

| | | | |
|---|---|---|---|
| 2,692,961 A | 10/1954 | Fondiller | |
| 3,192,306 A * | 6/1965 | Skonnord | 174/16.1 |
| 3,909,502 A * | 9/1975 | Lacan | 174/494 |
| 4,743,329 A | 5/1988 | Hata | |
| 5,046,791 A * | 9/1991 | Kooiman | 312/265.1 |
| 5,163,507 A * | 11/1992 | Joshi | 165/135 |
| 5,775,051 A | 7/1998 | Nicolai et al. | |
| 5,930,972 A * | 8/1999 | Benner et al. | 52/653.1 |
| 6,113,667 A * | 9/2000 | Hyogo et al. | 75/255 |
| 6,296,498 B1 * | 10/2001 | Ross | 439/115 |
| 7,405,357 B2 * | 7/2008 | Laurosch et al. | 174/68.1 |
| 2002/0021557 A1 * | 2/2002 | Ishimine et al. | 361/720 |
| 2005/0193930 A1 | 9/2005 | Hartel et al. | |

FOREIGN PATENT DOCUMENTS

| | | |
|---|---|---|
| DE | 28 25 943 | 12/1979 |
| DE | 80 28 580.9 | 4/1981 |
| DE | 84 23 236.6 | 1/1985 |
| DE | 38 15 992 A1 | 9/1989 |

(Continued)

*Primary Examiner*—Teresa J Walberg
(74) *Attorney, Agent, or Firm*—Pauley Petersen & Erickson

(57) ABSTRACT

A coolant-conducting element with an enclosed, linearly extending hollow profiled body, having an exterior wall with a multitude of access openings spaced apart from each other in a longitudinal direction and open or closed but can be opened, toward a conduit arrangement located in the interior. The conduit arrangement has an inflow conduit and an outflow conduit to each of which a number of access openings are assigned. A coolant-conducting arrangement with such a coolant-conducting element is also disclosed.

34 Claims, 2 Drawing Sheets

FOREIGN PATENT DOCUMENTS

| | | |
|---|---|---|
| DE | 43 27 444 A1 | 2/1995 |
| DE | 44 39 551 C1 | 12/1995 |
| DE | 202 03 883 U1 | 11/2002 |
| FR | 2 359 579 | 2/1978 |
| JP | 02048216 A | 2/1990 |
| JP | 02148891 | 6/1990 |
| JP | 2002374086 | 12/2002 |

* cited by examiner

COOLANT GUIDING ELEMENT AND COOLANT GUIDING DEVICE

BACKGROUND OF THE INVENTION

1. Field of the Invention

This invention relates to a coolant-conducting element with an enclosed, linearly extending hollow profiled body, having an exterior wall with a multitude of access openings, which are spaced apart from each other in a longitudinal direction and are open, or closed but can be opened, toward a conduit arrangement located in the interior, as well as to a coolant-conducting arrangement for electric or electronic devices housed in a switchgear cabinet shelf or a rack or an information technology work station and having at least one coolant-conducting element.

2. Discussion of Related Art

A coolant-conducting element and a coolant-conducting arrangement with such a coolant-conducting element has a conduit for conducting the coolant, for example air, in a linearly extending profiled body, which has several openings for cooling the heat-producing electronic components used, for example, in a component carrier. However, the results of cooling thus obtained are often insufficient.

SUMMARY OF THE INVENTION

One object of this invention is to provide a coolant-conducting element, as well as a coolant-conducting arrangement having such a coolant-conducting element, which makes possible an increased cooling effect along with simple use and simple mounting options.

This object is attained with this invention having the characteristics discussed in this specification and in the claims. With the coolant-conducting element of this invention the conduit arrangement has an inflow conduit and an outflow conduit, to each of which a number of access openings are assigned. The coolant-conducting inflow conduit has the coolant-conducting element so embodied.

With these steps the construction of a cooling system with a specific coolant inflow and the outflow of heated coolant is possible using simple installation options.

With a compact construction, the effectiveness of the cooling is aided because the inflow conduit and the outflow conduit are separated from each other by a one-piece separation wall of the profiled body.

The separating wall can have an insulator of lower heat-conducting capabilities than the material of the profiled body.

In one embodiment the insulating means or the insulator is a hollow space extending over the length and substantially over the width of the separating wall, or is a heat-insulating solid body.

For conducting the coolant and the cooling output, the surrounding wall areas of the inflow conduit and the outflow conduit are coated.

Other embodiments, for manufacture and use, have the profiled body extruded from metal and of plastic.

The structure of the coolant-conducting arrangement is such that the coolant-conducting element is attached along a frame leg to at least one mounting rail, or is attached to the inside of a covering element.

The installation, and also retrofitting or modifying of the coolant-conducting arrangement, are aided because the frame leg is formed as a profiled frame with an integrated chamber, which is open toward the interior of the switchgear cabinet or the rack, into which the coolant-conducting element is inserted.

The steps, that holding elements are provided in the chamber, by which the coolant-conducting element can be fixed in place in the latter, also promote simple mounting.

Different embodiment possibilities have the coolant-conducting element snapped into the chamber and screwed in, glued in, welded in or soldered in or clamped in it.

Various installation possibilities are possible with the coolant-conducting element pushed in the longitudinal direction of the support profile from the direction of a front opening, or inserted perpendicularly with respect to the longitudinal direction via a longitudinal opening of the support profile, and from the coolant-conducting element has access openings on its accessible longitudinal side.

An improved cooling effect is achieved if the cooling ribs extending in the longitudinal direction are arranged on the coolant-conducting element.

An assembly chamber becomes usable with as high as possible a degree of effectiveness because the exterior cross-sectional contour of the coolant-conducting element is matched to the interior cross-sectional contour of the chamber.

Further advantages in connection with the structure and, for example, the ruggedness, as well as mounting possibilities, of a rack result because the profiled frame has at least two chambers, one of which forms the receiving chamber for the coolant-conducting element, and the additional ones which each is used for assembly purposes and/or reinforcement purposes.

Along with a simple construction, a simple fixing in place of the coolant-conducting elements results because two holding strips, which are pointed toward each other, are arranged in the clear opening area of the chamber.

If the coolant-conducting element is connected, or connectable, to a coolant supply and/or coolant removal device via one or two connecting elements inserted into the profiled frame at one or both front faces, and/or via adapters inserted into the access openings, simple connection possibilities to cooling units are achieved.

In one advantageous construction of the coolant-conducting arrangement, the coolant-conducting arrangement conducts a liquid cooling medium and is connected to an air/liquid heat exchanger or a liquid/liquid heat exchanger.

The specific and effective cooling, in particular of electronic components which produce large amounts of heat, is achieved because the coolant-conducting element is connected via the access openings to cooling elements, which are thermally coupled with electronic components.

BRIEF DESCRIPTION OF THE DRAWINGS

This invention is explained in view of exemplary embodiments shown in the drawings, wherein.

DESCRIPTION OF PREFERRED EMBODIMENTS

Figure 1A:
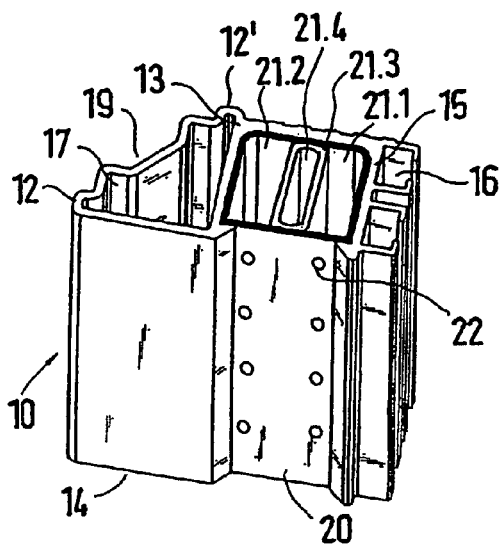
FIGS. 1A, 1B and 1C, respectively, represent a section of a profiled frame with an inserted or insertable coolant-conducting element in a perspective plan view.

A frame leg in the shape of a profiled frame 10 is shown in FIGS. 1A to 3 and is embodied as a profiled multi-chamber wherein, for constructing a shelf 1 (see FIG. 2), outward directed sealing edges 12, 12', as well as a free space 19 with an obliquely extending profiled wall are formed in an outer edge area, while an open hollow space in the form of a chamber 11 is provided toward the interior of the shelf 1 to be constructed. A coolant-conducting element 20 in the form of a closed multi-chamber hollow profile is inserted into the chamber 11. The interior of the hollow profile has a conduit arrangement with conducting conduits 21, such as an inflow conduit 21.1 and an outflow conduit 21.2, separated from the former by a separating wall 21.3. A row of access openings 22 are arranged on the opening side of the coolant-conducting element 20 oriented toward the inside chamber, through which a flow connection with the conducting conduits 21 extending in the interior of the coolant-conducting element 20 is provided. The access openings 22 can be closed by prepared predetermined breaking points or inserted caps, or can contain connecting elements, or can also remain open for cooling purposes.

The outer cross section of the coolant-conducting element 20 is matched to the inner cross section of the hollow space 11 and comprises a suitable material, in particular plastic or metal, for the respective coolant to be conducted, for example air or a liquid coolant. The separating wall 21.3 is made of one piece with the coolant-conducting element 20, for example in the course of the extrusion process. The separating wall is heat-insulating, for which purpose a further hollow chamber or a well heat-insulating solid body element is inserted as the insulating means 21.4. The wall surfaces surrounding the inflow conduit 21.1 and the outflow conduit 21.2 can be coated with a smooth and/or heat-insulating and permanent material.

The profiled frame 10 receiving the coolant-conducting element 20 forms a support profile with a support profile section 13 for the shelf 1. The hollow space 11, which is accessible from the inner opening side in the form of a longitudinal opening 11.2 has an approximately rectangular of square base shape, which is surrounded by lateral walls 11.3 and a base wall 11.4 and, at the free areas of the lateral walls 11.3 in the area of the longitudinal opening 11.2, has holding strips 11. 1, or holding ribs, which are directed against each other (see FIG. 3), and which are provided toward the outside with insertion bevels or curvatures, and toward the inside of the hollow space or the chamber 11 with right-angled shoulders, for example, so that the coolant-conducting element 20, which has round edges on its side opposite its inlet openings 22, can be pushed and snapped in, when the profiled frame 10 and/or the coolant-conducting element 20 each is embodied appropriately elastic. Alternatively, it is also possible to introduce the coolant-conducting element 20 in the longitudinal direction into the hollow space 11.

Figure 2:
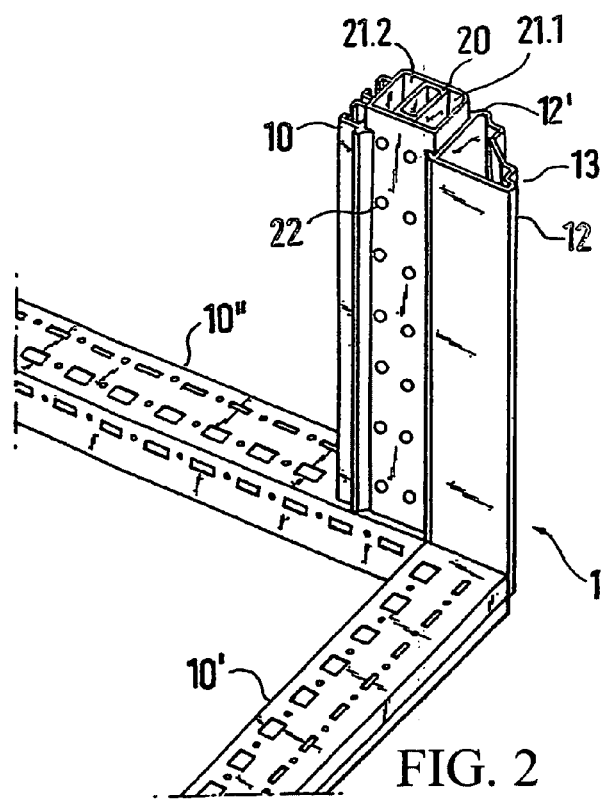
FIG. 2 shows a perspective view of a portion of a rack in the area of a corner, wherein a vertical frame leg is embodied as a profiled frame with a coolant conductor.

The profiled frame 10 is advantageously used as at least one vertical frame leg of the shelf 1, which is connected by suitable corner connectors or by simple screwing with top frame and bottom frames formed of horizontal frame legs 10, 10', 10" over the width or depth, as shown in FIG. 2. The coolant can be introduced into the coolant-conducting element 20 of the shelf 1 at the front or through suitable access openings 22, and removed from it again, for example by a pump or a ventilator. Built-in devices to be cooled can be individually connected by appropriate lines and connectors at their housings, or the entire switchgear cabinet interior can be cooled. During this, coolant or air can be supplied through the inflow conduit 21.1, and heated coolant or air can be removed through the outflow conduit 21.2.

The coolant-conducting element 20 can also have cooling ribs 23, which are arranged in the longitudinal direction, which protrude, for example, toward the opening side from an intermediate wall which closes off the conducting conduit 21 and extends parallel with the opening side. In this way the cooling ribs can cool heated air brought in through the access openings 22, wherein the heat can be removed via the coolant, liquid or air, flowing in the coolant conduits 21.

Figure 1B:
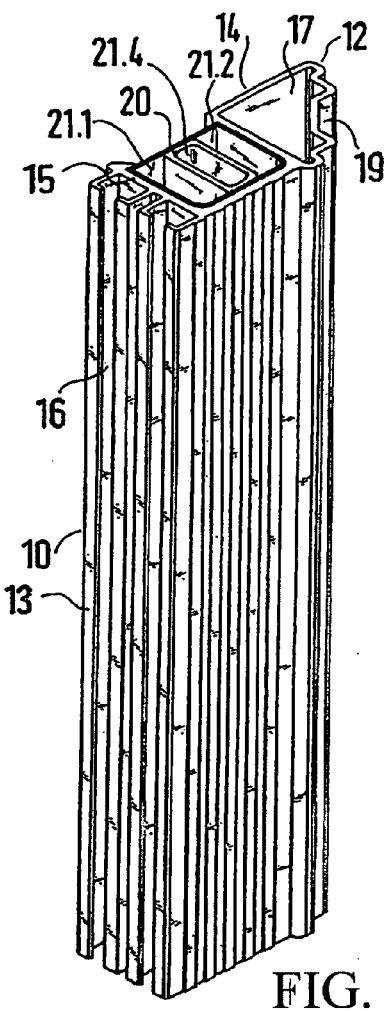
Figure 1C:
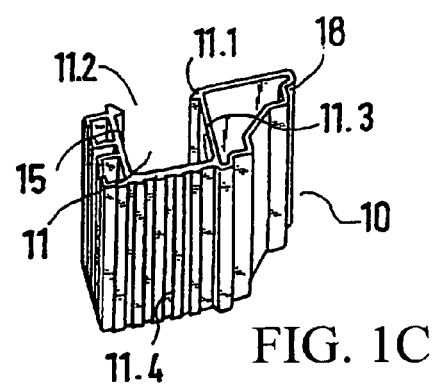
Figure 3:
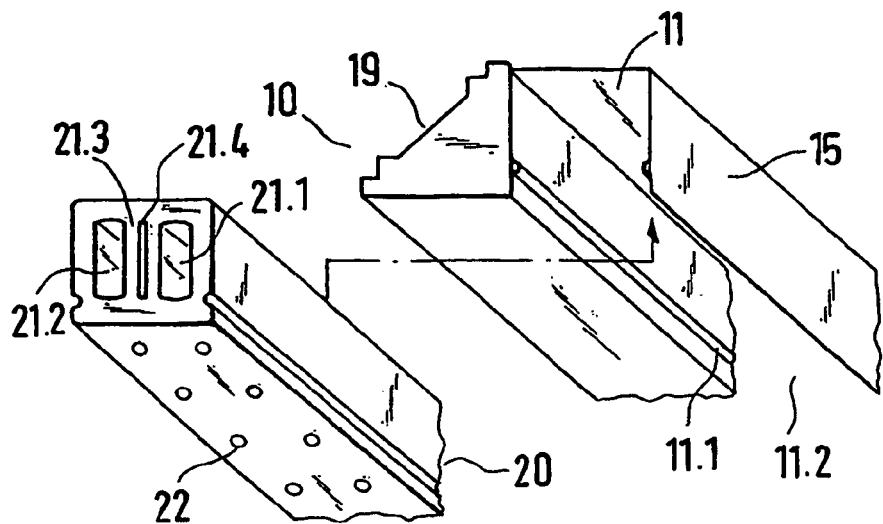
FIG. 3 shows a perspective view of a profiled frame and a coolant-conducting element to be inserted.

For example, as represented in FIG. 1C, the profiled frame 10 has an outer profile side 15 forming the lateral wall 11.3, as well as an inner profile side 14 facing the interior of the shelf 1, which also follows from FIGS. 1A, 1B and 3, together with FIG. 2. In the present case, two T-grooves 16 extending in the longitudinal direction, are formed on the outer profile side 15, by which fastening opportunities for mounting element exist. It is possible to provide rows of fastening openings, for example, in the inner profile side 14, which adjoins laterally with respect to the longitudinal openings 11.2 in the direction toward the outside of the shelf 1 and forms the inner wall of a further closed chamber 17 of the profiled frame 10, so that further fastening opportunities exist, such as shown for example by the lower horizontal frame legs in FIG. 2 and as known.

In connection with a work station system, for example with a desk arrangement, the lateral supports can for example be embodied as column-like frame legs made of profiled frames 10 with a coolant-conducting device in accordance with the above remarks. The access openings to the coolant-conducting devices are arranged on the inside or outside of the frame legs facing the table top or a support plate located above it, so that electrical devices, in particular devices in connection with information technology, such as computers, servers or monitors or the like, positioned on the table top or the support plates, can be easily connected by appropriate adapter elements to the coolant-conducting device for cooling. One or several rows of fastening receivers are cut into the insides of the vertical frame legs and extend in the longitudinal direction for suspending support elements for the table tops or support plates or similar receiving elements, from which the support arms in the form of horizontal frame legs made of profiled frames with coolant-conducting elements of the type described can be suspended or to which they can be screwed. The connection of horizontal and vertical coolant-conducting elements 20 can be provided by simple connecting elements having a conduit for the coolant and connecting elements. The frame legs are preferably flat, at least on their inside, and for example can substantially have a rectangular cross section or can be rounded on their outside. With the profiled frames as vertical and/or horizontal frame legs, there are many connecting possibilities and branching possibilities of the coolant-conducting devices.

The terms shelf, rack, switchgear cabinet, work station system are understood to include such arrangements or combinations thereof in connection with information technology (IT), for example frame structures or shelves or tables for monitors or server cabinets or the like.

Figure 4:
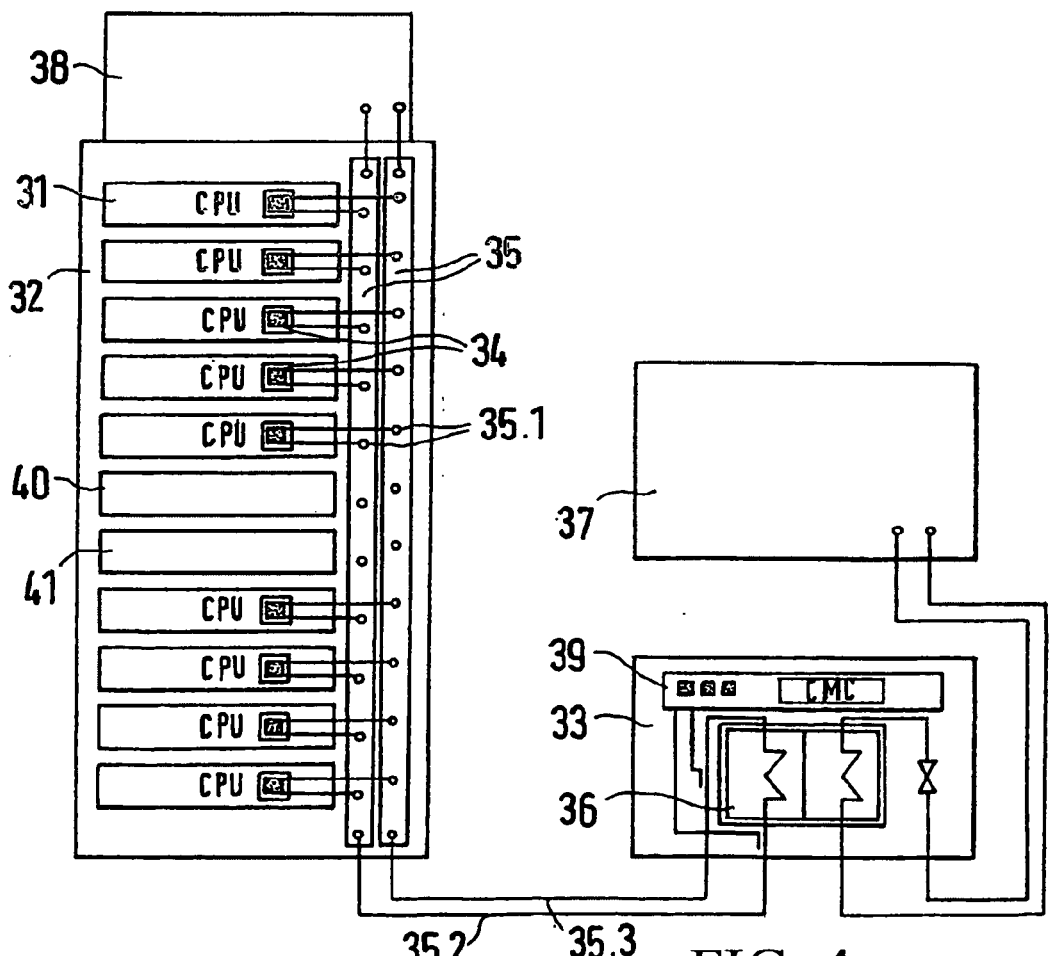
FIG. 4 is a schematic view of a coolant-conducting arrangement with a coolant-conducting element in accordance with FIGS. 1A to 3.

FIG. 4 shows an example of the construction of a coolant-conducting arrangement with a cooling-conducting element 20 installed in the above described manner. Here, the coolant-conducting arrangement is embodied as a liquid cooling system for cooling a plurality of electronic components 31 housed in a rack 32, which respectively has at least one central processing unit (CPU) 1.1 of high computing output in a housing containing the electronic component 31 as the main heat producer.

For cooling the electronic component 31, in particular the processing units or the computer units embodied as an integrated component, cooling elements 34 of the liquid cooling units, provided with conduits, are attached to the component body with close heat-conducting contact, through which the coolant is conducted on as long as possible a path. The liquid cooling units with the cooling elements 4 are connected via respective inflow branch lines and outflow branch lines with the inflow conduit 21.1 and the outflow conduit 21.2 by connecting elements via the access openings 22. In the lower area, the cooling-conduit element 20 is connected via a further section of the inflow branch 35.2 and of the outflow branch 35.3 to a water/water heat exchanger 36 enclosed in an electronics housing 33. A monitoring and control device 39 for functions of the switchgear cabinet or rack 32 is received in the electronics housing 33 and, inter alia, is also connected to the inflow branch 35.2 and the outflow branch 35.3 for detecting the temperatures of the existing liquid or the water.

In order to prevent too high room temperatures, the water/water heat exchanger 6 is connected by further lines to a re-cooling installation 7, which assures a dependable cooling of the coolant and offers the opportunity to emit the generated heat also outside of the space, for example, in which the rack 32 or the switchgear cabinet with the electronic components to be cooled are located.

Moreover, the upper area of the central liquid line system 35 with the coolant-conducting element 20 is connected via further lines to an air/water heat exchanger 38, arranged on the rack 32 or the switchgear cabinet, by which further cooling of the liquid is achieved and furthermore, with an appropriate design, the general temperature in the area of the component groups, or in the interior of the switchgear cabinet, can be reduced.

Furthermore, a monitor-keyboard unit 40 and a server switch control 41 are also arranged by way of example in the rack 32 which because of the small heat output, need not be connected to the central liquid line system 5.

If, by means of temperature sensors or liquid flow monitors in or on the liquid line system, the monitoring and control device 39 detects that, for example, the absolute temperature in the outflow branch 35.3, or a temperature difference between the inflow branch 35.2 and the outflow branch 35.3 exceeds a preset or presettable threshold, it issues an error signal or error report, by which a warning lamp or a warning sound can be switched on, or a display for informing a user can be controlled, wherein it is also possible to pass it on to a remote monitoring station via a network connection. Also, the monitoring and control device 39 can be embodied in such a way that, in case of the appearance of an error signal, it shuts off the common electrical current supply to the electronic components 31 located in the rack 32, or the switchgear cabinet, so that there is no damage due to the temperature, to this installation, which as a rule is expensive.

The invention claimed is:

1. A frame profile (10) for a frame structure of a rack, comprising a multi-chamber profile structure including:
    a support profile section (13) having an outward facing profiled wall obliquely extending between two lateral walls and forming a first free space (19) in a first outer edge area of the frame structure;
    a linearly extending hollow profiled body integrally attached to the support profile section (13), the profiled body including an integrated hollow chamber (11) with a longitudinal opening (11.2) facing an interior of the frame structure;
    the hollow chamber (11) including a rectangular or square base shape and surrounded by lateral walls (11.3) and a base wall (11.4) that is opposite the longitudinal opening (11.2) and oriented on an outside of the frame structure in parallel to the outside of the frame structure;
    a coolant-conducting element (20) inserted into the hollow chamber (11), the coolant-conducting element (20) having an exterior wall in an area of the longitudinal opening (11.2), the exterior wall including a plurality of access openings (22) spaced apart from each other in a longitudinal direction toward a conduit arrangement (21.1, 21.2) located in an interior of the coolant-conducting element (20);
    the conduit arrangement having an inflow conduit (21.1) and an outflow conduit (21.2) to each of which a number of the access openings (22) are assigned.

2. The frame profile section according to claim 1, further comprising at least one holding element (11.1) over at least a portion of the first longitudinal opening (11.2), wherein the coolant conductor (20) is fixed in place by the holding element (11.1).

3. The frame profile section according to claim 1, further comprising means for closing said access openings (22).

4. The frame profile section according to claim 1, wherein the inflow conduit (21.1) and the outflow conduit (21.2) are separated from each other by a one-piece separation wall (21.3) of the profiled body.

5. The frame profile section according to claim 4, wherein the separating wall (21.3) has an insulator (21.4) with lower heat-conducting capabilities than a material of the profiled body.

6. The frame profile section according to claim 5, wherein the insulator (21.4) comprises a heat-insulating solid body or hollow space extending over a length and substantially over a width of the separating wall (21.3).

7. The frame profile section according to claim 6, wherein the heat-insulating solid body and surrounding wall areas of the inflow conduit (21.1) and the outflow conduit (21.2) are coated.

8. The frame profile according to claim 5, wherein the profiled body is extruded from metal or plastic.

9. The frame profile according to claim 5, forming a coolant-conducting arrangement for electrical devices housed in one of a switchgear cabinet or an IT-work station.

10. The frame profile according to claim 5, wherein the coolant-conducting element (20) is snapped into the chamber (11), and is one of screwed in, glued in, welded in, soldered in and clamped in the chamber (11).

11. The frame profile according to claim 10, wherein the coolant-conducting element (20) is one of pushed in the longitudinal direction of a support profile (18) from a front opening and inserted perpendicularly with respect to the longitudinal direction via the longitudinal opening (11.2) of the support profile (18), and the coolant-conducting element (20) has the access openings (22) on a longitudinal side accessible via the longitudinal opening (11.2).

12. The frame profile according to claim 5, wherein cooling ribs (23) extending in the longitudinal direction are arranged on the coolant-conducting element (20).

13. The frame profile according to claim 5, wherein an exterior cross-sectional shape of the coolant-conducting element (20) is matched to an interior cross-sectional shape of the chamber (11).

14. The frame profile according to claim 1, wherein the profiled frame (10) has a second chamber (17) and the chamber (11) for the coolant-conducting element, and the second chamber (17) is used for at least one of assembly or reinforcement.

15. The frame profile according to claim 2, wherein two holding strips (11.1) pointed toward each other are arranged in a clear opening area of the chamber (11).

16. The frame profile according to claim 1, wherein the coolant-conducting element (20) is connectable to at least one of a coolant supply and a coolant removal device via at least one connecting element inserted at least one of into the profiled frame (10) at least at one face or via adapters inserted into the access openings (22).

17. The frame profile according to claim 16, wherein the coolant-conducting element (20) conducts a liquid cooling medium and is connected to at least one of an air/liquid heat exchanger (8) and a liquid/liquid heat exchanger (6).

18. The frame profile according to claim 16, wherein the coolant-conducting element (20) is connected to cooling elements which are thermally coupled with electronic components (31) via the access openings (22).

19. The frame profile according to claim 16, wherein surrounding wall areas of the inflow conduit (21.1) and the outflow conduit (21.2) are coated.

20. The frame profile according to claim 1, wherein the support profile section and the profiled body are extruded from metal or plastic.

21. The frame profile according to claim 1, forming a coolant-conducting arrangement for electrical devices housed in one of a switchgear cabinet or an IT-work station and having at least one coolant-conducting element (20).

22. The frame profile according to claim 1, wherein the frame profile is a frame leg (10, 10', 10") to be attached to an inside of a covering element.

23. The frame profile according to claim 22, wherein the frame leg (10) is a profiled frame with the integrated chamber (11) open toward an interior of the switchgear cabinet.

24. The frame profile according to claim 2, wherein the coolant-conducting element (20) is snapped into the chamber (11), and is one of screwed in, glued in, welded in, soldered in and clamped in the chamber (11).

25. The frame profile according to claim 1, wherein the coolant-conducting element (20) is one of pushed in the longitudinal direction of a support profile (18) from a front opening and inserted perpendicularly with respect to the longitudinal direction via a longitudinal opening (11.2) of the support profile (18), and the coolant-conducting element (20) has access openings (22) on a longitudinal side accessible via the longitudinal opening (11.2).

26. The frame profile according to claim 1, further comprising cooling ribs (23) extending in the longitudinal direction and arranged on the coolant-conducting element (20).

27. The frame profile according to claim 1, wherein an exterior cross-sectional shape of the coolant-conducting element (20) is matched to an interior cross-sectional shape of a chamber (11) of the profiled body.

28. The frame profile according to claim 1, wherein the profiled frame (10) has at least two chambers (11, 17) and one of which forms the hollow chamber (11) for the coolant-conducting element, and a second chamber (17) of the support profile section (13) is used for at least one of assembly or reinforcement.

29. The frame profile according to claim 1, wherein the coolant-conducting arrangement (20) conducts a liquid cooling medium and is connected to at least one of an air/liquid heat exchanger (8) and a liquid/liquid heat exchanger (6).

30. The frame profile according to claim 1, wherein the coolant-conducting element (20) is connected to cooling elements which are thermally coupled with electronic components (31) via the access openings (22).

31. The frame profile section according to claim 1, further comprising two outward directed sealing edges (12, 12'), each of the sealing edges (12, 12') at an outer edge of one of the lateral walls of the support profile section (13), wherein the outward facing profiled wall obliquely extends between the two outward directed sealing edges (12, 12').

32. The frame profile section according to claim 1, wherein one of the lateral walls of the support profile section (13) is also one of the lateral walls (11.3) of the hollow profiled body.

33. The frame profile section according to claim 32, wherein an other of the lateral walls of the support profile section (13) includes fastening openings for fastening horizontal frame elements.

34. The frame profile section according to claim 32, wherein an other of the lateral walls (11.3) of the hollow profiled body, which is opposite the support profile section (13) includes a mounting groove (16).

* * * * *